United States Patent
Winkler

Patent Number: 5,959,449
Date of Patent: Sep. 28, 1999

[54] PROCESS FOR THE DETERMINATION OF ELECTRICAL VALUES WITHOUT CONTACTING

[76] Inventor: Franz Winkler, Dafertgasse 2, A-1210 Vienna, Austria

[21] Appl. No.: 08/976,397

[22] Filed: Nov. 21, 1997

Related U.S. Application Data

[63] Continuation of application No. 08/343,591, filed as application No. PCT/AT93/00102, Jun. 16, 1993, abandoned.

[51] Int. Cl.[6] ..................................................... G01R 1/06
[52] U.S. Cl. ..................................... 324/117 R; 324/149
[58] Field of Search .............................. 324/117 R, 127, 324/129, 149, 259

[56] References Cited

U.S. PATENT DOCUMENTS

| | | | |
|---|---|---|---|
| 3,693,075 | 9/1972 | Forster | 324/229 |
| 4,227,147 | 10/1980 | Miller | 324/72 |
| 4,558,310 | 12/1985 | McAllise | 340/661 |
| 4,625,176 | 11/1986 | Champion et al. | 324/72.5 |
| 4,788,504 | 11/1988 | Blanpain et al. | 324/377 |
| 4,804,915 | 2/1989 | Hoenig | 324/248 |
| 4,835,461 | 5/1989 | Snelling | 324/109 |
| 4,853,639 | 8/1989 | Vosteen et al. | 324/457 |
| 5,539,319 | 7/1996 | Yamada | 324/458 |

FOREIGN PATENT DOCUMENTS 471986 4/1976 Australia.

OTHER PUBLICATIONS

IBM Technical Disclosure Bulletin, vol. 10, No. 7, Dec. 1967; "Amplification of Extremely Low DC Currents and Voltages".

IEEE Transactions on Magnetics, vol. 26, No. 5, Sep. 1990; "300 A Current Sensor Using Amphorous Wire Core"; Kashiwagi et al.

*Primary Examiner*—Ernest F. Karlsen
*Assistant Examiner*—Russell M. Kobert
*Attorney, Agent, or Firm*—Liniak, Berenato, Longacre & White

[57] ABSTRACT

A method for determining electrical measurement variables (e.g. DC or AC voltages or currents, powers or resistances) without physically contacting a conductor (1) includes at least two coil systems (6) arranged at a distance from one another. The coil systems (6) are positioned in the electromagnetic field of the conductor (1). The coils (6) and/or an electrically conductive component (3) in the vicinity of the coils (6) are set into periodic mechanical oscillation for the determination of DC voltages and/or direct currents. Consequently, determination of electrical measurement variables is achieved without physically contacting an electrical conductor which cannot be completely surrounded.

9 Claims, 3 Drawing Sheets

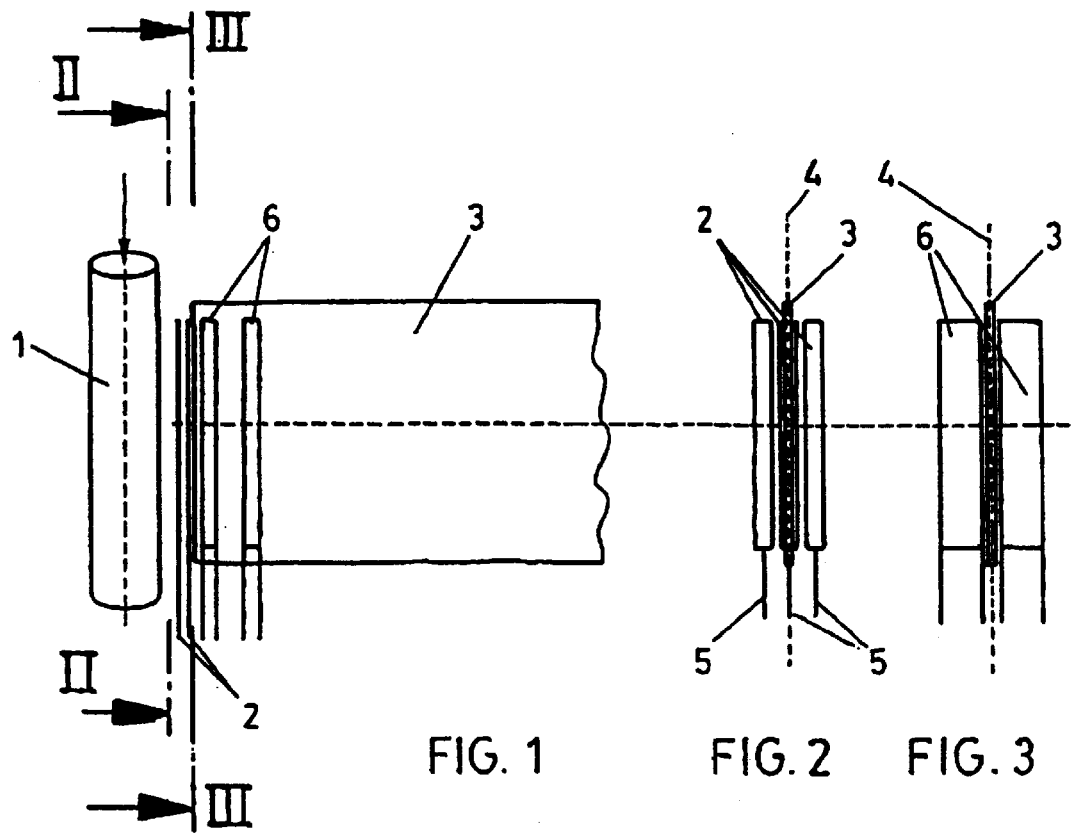
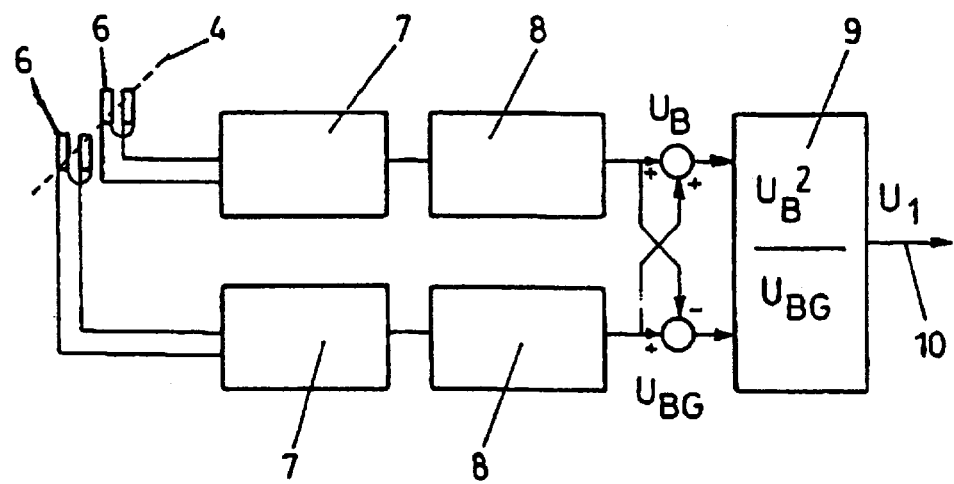
FIG. 1  FIG. 2  FIG. 3
FIG. 4

PROCESS FOR THE DETERMINATION OF ELECTRICAL VALUES WITHOUT CONTACTING

This application is a continuation, of application Ser. No. 08/343,591 filed Jun. 30, 1995, now abandoned, which is a 371 of PCT/AT93/00102, filed Jun. 16, 1993.

BACKGROUND OF THE INVENTION a) Field of the Invention

The invention relates to a method for measuring electrical variables (e.g. DC or AC voltages or currents, powers or resistances), in a conductor, without contacting the conductor.

b) Description of Related Art

Conventionally, determination of current in electrical conductors is accomplished in a non-touching manner with an adapter intended to surround the conductor as completely as possible. If a coil system is associated with a magnetically permeable material which substantially surrounds the conductor through which current flows, a variable which is proportional to the current in the electrical conductor is induced in such a coil system and, as a result of the known proportionality of the induction current to the measurement variable, determination of current strengths without physical contact is possible. To determine direct currents with the aid of such adapters, the current measurement is based on a magnetic field measurement using Hall probes or magnetization characteristic probes. However, these probes have disadvantages with respect to offset, noise and temperature errors. Another disadvantage of this method is that it can be carried out only when the conductor in which the current to be determined is substantially surrounded.

It is known that electromagnetic alternating fields in coils induce signals which can be used to produce different indications. A quantitative determination of the measurement variable itself is generally not directly possible owing to the lack of suitable reference fields.

IBM Technical Disclosure Bulletin, Vol. 10, No. 7, December 1967, page 876 discloses a coil system to be set into mechanical oscillation in order to amplify very small direct currents and DC voltages. Australian publication AV-B-471 986 discloses a magnetometer in which a conductor is set into oscillation and the signal induced by a magnetic field is measured.

SUMMARY OF THE INVENTION

An object of the present invention is a method of determining DC or AC voltages, currents, powers or resistances without physical contact, even when extremely small measurement variables are to be detected. Furthermore, the measurement variables are more exactly and consistently determined. In order to achieve this object, the method according to the present invention comprises arranging at least two coil systems at a distance from one another in the electromagnetic field of the conductor. An electrically conductive component associated with the coils of these coil systems is set into periodic mechanical oscillation, and the signals from the coils (possibly after correcting their phases) are fed to a subtraction circuit in order to determine a voltage difference or a voltage gradient. The quotient of the square of a voltage measured value and the voltage gradient is computed in an evaluation circuit and fed to an output. In addition to the at least two coil systems which are arranged at a distance from one another, a further coil system is provided which is arranged at a distance which is a multiple of half the wavelength of the periodically oscillating component. The measured values from two coil systems which are offset by this distance are compared. The fact that two coil systems which are arranged at a distance from one another are used initially ensures that different voltages are induced in the two coil systems, the difference corresponding to their separation. With regard to the known separation between the two coil systems and/or with regard to the circumstance that the difference of the measurement variables now makes compensation possible, it is possible to calculate back to and/or deduce the actual measurement variable to be measured. In determining DC voltages and/or direct currents, it is necessary to ensure corresponding induction by the coils and/or an electrically conductive component in the vicinity of the coils being set into periodic mechanical oscillation.

For determining direct currents and/or DC voltages without physical contact, it is advantageous to use ultrasound oscillations to create the mechanical oscillations. Ultrasonically induced mechanical oscillations naturally avoid producing any interference with the measurement, even in the case of low-frequency AC voltages or alternating currents, because of the relatively high frequency of the ultrasound oscillations. It is possible to distinguish in a simple manner between DC voltages and direct currents and/or AC voltages and alternating currents by switching off the oscillation exciter. In the case of DC voltages and/or direct currents, no further signal for evaluation is available any longer.

The evaluation of the electrical signals which are induced in such a coil system is carried out according to the invention such that the signals from the coils, possibly after their phases have been corrected, are fed to a subtraction circuit in order to determine a voltage difference and/or a voltage gradient. The quotient of the square of a voltage measured value and the voltage gradient is computed in an evaluation circuit and is fed to an output. Such a quotient makes it possible to compare the measured values from two coil systems which are displaced with respect to one another by a multiple of half the wavelength of the periodically oscillating part. An improvement in the measurement accuracy can be achieved by subjecting the coil system facing away from the conductor to a system for the production of reference fields. The reference fields are controlled and varied until the measured values of the coil systems reach a balance at zero. Such a procedure allows very small measurement variables to be detected exactly and consistently.

In order to ensure the measured values are not adversely affected by the driver for the mechanical exciter, the method according to the invention can advantageously be carried out such that the exciter(s) of the mechanical periodic oscillations are operated intermittently. Consequently, the measured values of the coil systems are subjected to evaluation and processing with the exciter(s) switched-off. Particularly in the case of ultrasonically induced oscillations, it can be assumed that, after the mechanical exciter has been switched off, the periodic oscillations do not decay so quickly as to preclude a sufficiently long time period for measurement with uniform periodic oscillations and subsequent evaluation.

In the determination of direct currents, when it is possible for the electrical conductor to be completely surrounded by a part of the measurement probe, an advantage of the present invention is that, instead of the magnetic field measurement using Hall probes or magnetization characteristic probes, a magnetic field measurement (and a subsequently derived current determination) are based on the signal from at least one coil, possibly interacting with magnetically permeable components along a portion of the field lines. The signal is processed while at least one magnetic component, the coil itself, or an electrically conductive part in the vicinity of the coil is set into periodic mechanical oscillation. The electrical coil system can advantageously be arranged in a gap or in the vicinity of the gap of an annular, magnetically permeable component surrounding the electrical conductor. The mechanical excitation being applied only to the magnetically conductive component, the coils, or to an electrically conductive component in the vicinity thereof. In this way, measurement signals for current determination are obtained even when the probe does not completely surround the conductor.

In determining voltages without physical contact, the electrical field must be used as the measurement variable. Inasmuch as an electrical field can influence voltage in electrical conductors, it is subsequently possible to measure potential differences between the influenced voltage and a reference voltage. The method for determining electrical voltages without physical contact according to the present invention is carried out with at least two electrodes moved into the electrical field of the conductor. In determining DC voltages, the electrodes and/or an electrically conductive component are set into periodic oscillation, and the potential of an influenced voltage being measured with respect to a reference voltage.

The invention will now be explained in more detail with reference to exemplary embodiments illustrated schematically in the drawings.

BRIEF DESCRIPTION OF THE DRAWINGS

FIG. 1 shows a schematic illustration of a first embodiment for carrying out the method according to the present invention.

FIG. 2 shows a partial view in the direction of the arrows II—II in FIG. 1.

FIG. 3 shows a partial view in the direction of the arrows III—III in FIG. 1.

FIG. 4 shows, schematically, a circuit diagram for evaluation of measurement variables which are recorded using the coil systems designed according to FIG. 1 according to the present invention.

DESCRIPTION OF THE PREFERRED EMBODIMENT

Figure 5:
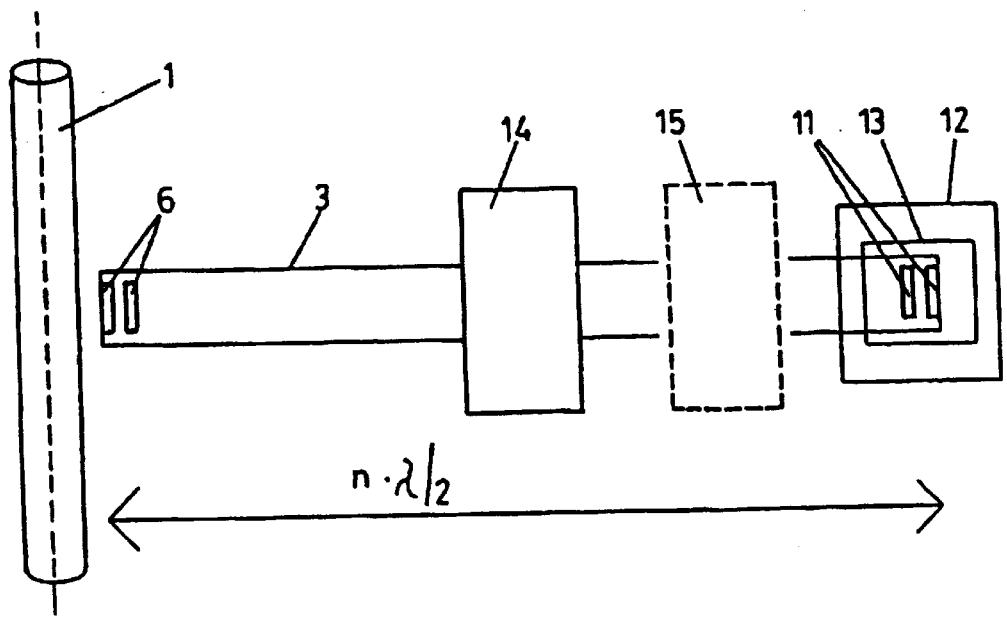
FIG. 5 shows, in an illustration similar to FIG. 1, a modified embodiment for carrying out the method according to the present invention using a reference coil system.

In FIG. 1, reference numeral 1 designates an electrical conductor in which an electrical measurement variable is intended to be determined without physical contact with the electrical conductor 1. For determining DC voltages, electrodes 2 are moved into the vicinity of the electrical conductor 1, at different distances from the conductor. The electrodes are supported by a component 3 which can be set into periodic mechanical oscillation and is itself, electrically conductive. The mutual spatial arrangement of the electrodes 2 and the electrically conductive and oscillating component 3 is illustrated in more detail in FIG. 2. Reference numeral 4 indicates in dashed lines the centerline of the oscillating component 3. The connections 5 to the electrodes are also indicated in FIG. 2. The electrical field in the vicinity of the conductor 1 is distorted by the periodically moved electrically conductive component 3. Consequently, a signal in the electrodes 2 is influenced. The signal can be used, after evaluation, to determine the electrical measurement variable.

Additionally, or alternatively it is further provided that duplicate coil systems 6, which are likewise arranged at different distances from the conductor 1, are moved into the vicinity of the conductor 1. The coils 6 interact with the periodically oscillating component 3 for the determination of direct currents and alternating currents in the electrical conductor. Inasmuch as movement of the component 3 distorts the magnetic field as a result of the eddy currents in this component, a signal is induced in the coils 6 which can be used, after evaluation, for determination of the electrical measurement variable.

The spatial arrangement of the coil systems 6 relative to the periodically oscillating component 3 is illustrated in more detail in FIG. 3. The coils 6 being arranged symmetrically with respect to the component 3 in the embodiment shown so that a total of four coils are used which are in each case arranged in pairs. This contributes to an increase in the accuracy in the determination of the electrical measurement variable. The arrangement of only two coils at different distances from the electrical conductor 1 is, however, sufficient. If duplicate coils 6 are used, it is irrelevant whether the signals from the individual coils are linked prior to, within, or after the evaluation circuit 7.

Instead of using the electrically conductive and periodically oscillating component 3, the coils 6 and/or electrodes 2 themselves can be set into oscillation so that corresponding signals can be induced in the oscillating coils 6 and/or electrodes 2. When measuring AC voltages or alternating currents, it is possible to dispense with the oscillating component 3 and/or an oscillating arrangement of the coils 6, since corresponding measurement variables can be picked off in accordance with known laws.

In addition to the determination of voltages and/or current strengths, resistances and powers can be derived from the obtained signals in accordance with laws which are likewise known.

In the case of the schematic circuit which is illustrated in FIG. 4, the coils 6 are indicated as arranged in pairs relative to the centerline 4 of the oscillating component 3, in an analogous manner to the embodiment according to FIGS. 1 and 3. The signals which are picked off on the coils 6 are fed to a first evaluation element 7 in which matching, amplification and, possibly, phase compensation are carried out. Subsequently, they pass into an element 8 for crosstalk compensation, whereupon, a value $V_B$ is obtained for the voltage and a second value $V_{BG}$ for the gradient of the voltage between the two coils 6. The crosstalk compensation and the computation of $V_B$ and $V_{BG}$ can also be carried out in one operation. The quotient between the square of the voltage $V_B$ and the gradient $V_{BG}$ is subsequently computed, from which a voltage value $V_1$ is produced which can be output in the direction of arrow 10, for indication or further evaluation.

The measurement signals may be sent in a wire-free manner by radio transmission or by light transmission to an evaluation unit, and/or control signals are transmitted in a wire-free manner from the evaluation unit to the circuit.

Figure 6:
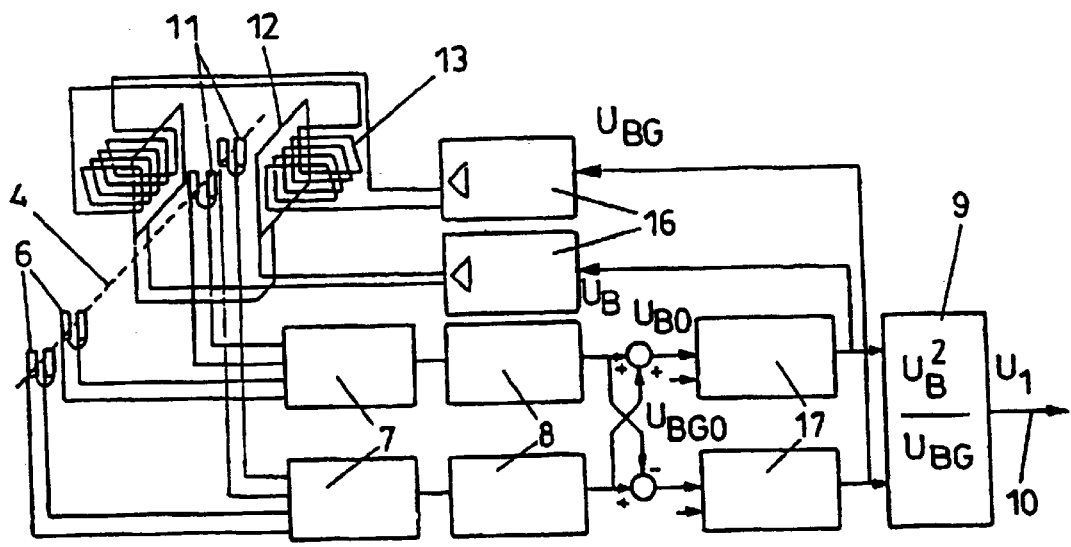
FIG. 6 shows a circuit diagram for evaluation of measurement variables recorded using the embodiment according to FIG. 5.

According to the present invention illustrated in FIGS. 5 and 6, the reference numerals from the preceding embodiment are maintained for identical components. In addition to the coil systems 6 which are arranged at different distances from the conductor 1, and interact therewith due to periodic oscillation of electrically conductive component 3 during the determination of DC voltages and/or direct currents, a further system of coils 11 is provided at a distance which corresponds to a multiple n of half the wavelength of the periodically oscillating component 3. The system of coils 11 being subjected to a coil system 12 for simulation of the voltage value $V_B$ to be detected and to a coil system 13 for simulation of the voltage gradient $V_{BG}$ to be determined, as illustrated in FIG. 6.

The periodically oscillating electrically conductive component 3 is excited to oscillate by a schematically indicated piezocrystal 14. The piezo element 14 being located at a node of the oscillation of the component 3. As an alternative to the exciter 14, an electromagnetic oscillator 15, which is indicated by dashed lines in FIG. 5, can be provided at an antinode of the oscillation of the component 3.

In addition to the components shown in FIG. 4, current drivers 16 are provided in the embodiment according to FIG. 6. The current drivers 16 are used to produce a reference field and/or to simulate the measurement variables to be determined. The signals from all the coils and/or coil systems 6 and 11 are in turn fed to the components 7 and 8, from which signals for the voltage $V_{B0}$ and the voltage gradient $V_{BG0}$ are fed to control amplifiers 17. Any change in the conditions in the reference coil systems 12 and 13 are passed via the current drivers 16 to correct the measurement variable of the coil systems 6 and 11. The quotient of the square of the voltage $V_B$ and the voltage gradient $V_{BG}$ is in turn computed in the element 9, from which the voltage value $V_1$ can be derived and fed for indication and/or evaluation via 10.

The carriers of the information for the magnetic field and the magnetic field gradient, respectively, in FIGS. 4 and 6 are amplitudes of the signals $V_B$ and $V_{BG}$ respectively, whose frequency and phase are predetermined by the ultrasonic oscillation of part 3. Thus, no information is lost if an amplitude demodulator (e.g. a rectifier, a synchronous demodulator, or multiplier controlled by the known ultrasonic oscillation), and a low-pass filter are provided in the signal paths. In any case, AM demodulation makes sense before passing the signal on for indication and/or to the input of the control amplifier. If simple rectification is used, phase compensation can be omitted.

Radio-frequency signals which are measured at the same time as or alternately with the ultrasound-frequency signals can also be evaluated and provided for indication in a further parallel signal path, possibly after frequency-response, phase-response and transit-time correction, in the same manner by computing $V_B$ and $V_{BG}$ and by quotient computation between the square of the signal $V_B$ and of the signal $V_{BG}$.

Since implementation of the circuit as an IC is expedient, the signals can be digitized even after matching and amplification in the element 7, and further signal processing, such as phase compensation, crosstalk compensation etc., can be implemented by computation algorithms. In FIG. 6, the control amplifiers 17 can likewise be implemented by control algorithms. Digital/analog conversion would have to be carried out again upstream of the current drivers 16.

Figure 7:
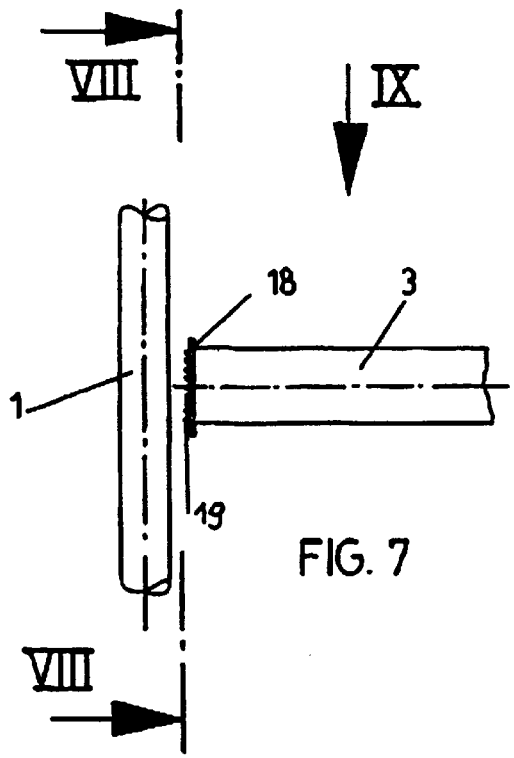
FIG. 7 shows, schematically, a further modified embodiment using only oscillating electrodes.
Figure 8:
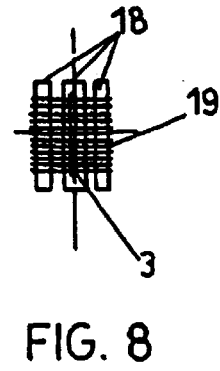
FIG. 8 shows a view in the direction of the arrows VII-VIII in FIG. 7.
Figure 9:
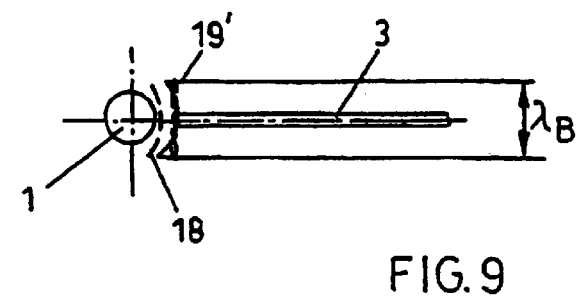
FIG. 9 shows a plan view in the direction of the arrow IX in FIG. 7.

According to FIGS. 7 to 9, wire elements or strip elements 19, which extend transversely with respect to the longitudinal axis of the conductor 1, are coupled directly to the periodically oscillating component 3. The length of the elements 19 is adapted such that they are excited to produce a bending oscillation when the component 3 is oscillating longitudinally, as is indicated schematically by 19' in FIG. 9 ($\lambda_B$ indicates the wavelength of the bending oscillation in FIG. 9). The electrical field in the vicinity of the conductor is distorted by the oscillating component 19, as a result of which signals in the electrodes 18 are influenced. The influenced signals can be used, after evaluation, for determination of the electrical measurement variables. In addition, a current measurement system having coils 6 can be used.

Figure 10:
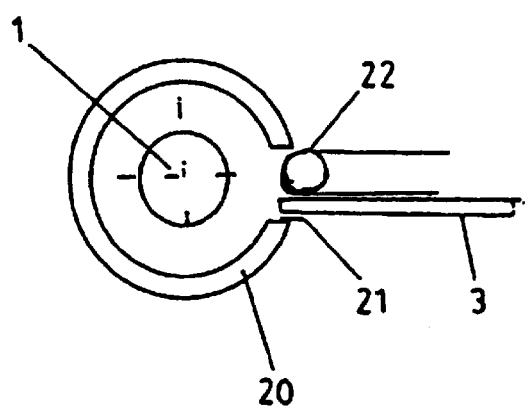
FIG. 10 shows a schematic illustration of the cross-section of a conductor including a further embodiment for carrying out the method according to the present invention.

In the case of the embodiment according to FIG. 10, the electrical conductor 1 is virtually completely surrounded by a magnetically permeable component 20. A coil and/or a coil system 22 is arranged in a gap 21 of the magnetically permeable component 20. The coil or coil system 22 is in turn coupled to a periodically oscillating component 3 for determination of direct currents and/or alternating currents.

When ultrasound is used to generate the mechanical oscillations of the component 3, amplitudes of 1 $\mu$m are used at a frequency of, for example, 50 kHz. Furthermore, when ultrasound is used, interference is avoided in the evaluation of the signals by operating the exciter intermittently such that the actual determination of the measurement variables to be determined is carried out in those time periods in which the exciter is switched off. When ultrasound is used, the oscillations decay so slowly that it is always possible to assume constant periodic mechanical oscillations in the relatively short time periods required for one measurement.

I claim:

1. A method for determining electrical measurement variables in a conductor without physical contact, the method comprising the steps of:

positioning a terminal end of an electrically conductive, non-ferromagnetic component adjacent to and extending substantially orthogonally from said conductor;

setting said component into periodic mechanical oscillations to produce eddy currents therein, and mounting at least one coil about said terminal end of the periodically oscillating component in a substantially stationary manner;

sensing a signal representative of a distorted magnetic field as a result of said eddy currents; and determining at least one of AC and DC currents in the conductor from said distorted magnetic field.

2. A method according to claim 1, wherein at least two coils are mounted in the vicinity of the periodically oscillating component.

3. A method according to claim 1, wherein ultrasound oscillations are used as mechanical oscillations.

4. A method according to claim 1, wherein the signals from the coils, possibly after their phases have been corrected, are fed to a summation circuit in order to determine a mean signal and to a subtraction circuit in order to determine a gradient signal, and in that the quotient of the square of the mean signal and the gradient signal is determined in an evaluation circuit and is fed to an output.

5. A method according to claim 1, wherein an exciter of the mechanical periodic oscillations is operated intermittently, and measured values of the coils are subjected to evaluation and processing with the exciter in a switched off state.

6. A method according to claim 1, wherein the phase of the signals from the coils is used to correct for the distance from the conductor under test.

7. A method according to claim 1, further comprising the step of:

mounting at least two electrodes in the vicinity of the periodically oscillating component to determine at least one of AC and DC voltages in the conductor.

8. A method according to claim 7, wherein an exciter of the mechanical periodic oscillations is operated intermittently, and measured values of the electrodes are subjected to evaluation and processing with the exciter in a switched-off state.

9. A method according to claim 7, wherein ultrasound oscillations are used as mechanical oscillations.

* * * * *